United States Patent
Choi et al.

(10) Patent No.: US 7,190,628 B2
(45) Date of Patent: Mar. 13, 2007

(54) SEMICONDUCTOR MEMORY DEVICE HAVING SELF REFRESH MODE AND RELATED METHOD OF OPERATION

(75) Inventors: Jung-Yong Choi, Bundang-gu (KR); Young-Gu Kang, Hanam-si (KR); Ki-Ho Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/328,237

(22) Filed: Jan. 10, 2006

(65) Prior Publication Data

US 2006/0164903 A1    Jul. 27, 2006

(30) Foreign Application Priority Data

Jan. 27, 2005    (KR) .................... 10-2005-0007412

(51) Int. Cl.
    *G11C 7/00* (2006.01)
(52) U.S. Cl. ...................... 365/222; 365/211

(58) Field of Classification Search ............. 365/222, 365/211, 189.09
See application file for complete search history.

(56) References Cited

U.S. PATENT DOCUMENTS

| | | | |
|---|---|---|---|
| 5,680,359 A * | 10/1997 | Jeong ................... | 708/620 |
| 6,483,764 B2 * | 11/2002 | Chen Hsu et al. ........ | 365/222 |
| 6,552,945 B2 | 4/2003 | Cooper et al. | |
| 6,717,457 B2 | 4/2004 | Nanba et al. | |
| 2005/0105367 A1 * | 5/2005 | Kim et al. ............. | 365/226 |

* cited by examiner

*Primary Examiner*—Vu A. Le
(74) *Attorney, Agent, or Firm*—Volentine & Whitt, PLLC

(57) ABSTRACT

A semiconductor memory device supporting a self refresh operation is disclosed and comprises an address buffer unit and an operation control unit. The address buffer unit may be enabled during the self refresh operation by a first external control signal to generate an internal address signal. The operation control unit controls the start of the self refresh operation in response to the internal address signal.

12 Claims, 3 Drawing Sheets

SEMICONDUCTOR MEMORY DEVICE HAVING SELF REFRESH MODE AND RELATED METHOD OF OPERATION

BACKGROUND OF THE INVENTION

1. Technical Field

Embodiments of the invention relate to a semiconductor memory device. More particularly, embodiments of the invention relate to a semiconductor memory device having a self refresh mode and a related method of operation.

This application claims priority to Korean Patent Application 2005-7412, filed on Jan. 27, 2005, the subject matter of which is hereby incorporated by reference in its entirety.

2. Description of Related Art

The semiconductor memory devices, such as Dynamic Random Access Memory (DRAM), used in mobile, battery powered host devices such as cellular telephone handsets or PDAs must operate with a minimum of power. Hence, low power memory devices are the norm, and as operating speeds for the various host devices increases the demand for power conservation in such low power memory devices increases. One aspect of low power memory device functionality being carefully considered in the quest for further reductions in power consumption is the refresh operation.

A refresh operation is required for volatile memory devices such as DRAM. Volatile memory devices are characterized by presence of an electrical charge on a capacitor associated with a memory cell in the memory device. Memory cell capacitors are not perfect in their form or function, and as a result, stored charge will escape as a leakage current. A refresh operation is periodically required to re-store charge to the memory cell capacitor. A conventional refresh operation may be viewed as a special "write" or re-write operation in which already stored data is read from memory and then written back into memory. The refresh operation takes place repeatedly a rate that precludes complete dissipation of the stored charge.

In order to maintain data stored in its memory cells, a memory device must periodically perform a refresh operation even when the host device or a memory system within the host device including the memory device is inactive. Thus, the refresh operation is always "on" making it a primary consideration in any attempt to reduce memory device related power consumption within the host device.

One conventional approach to minimizing the power consumption of a volatile memory device changes the period of refresh in accordance with sensed changes in the data retention period for memory cells in the memory device. This type of "self refresh" operation may monitor memory cell leakage current, and when a critical level of leakage current is sensed, a refresh operation is performed. Similarly, a critical stored charge value for the memory cells may be sensed and used to initiate a refresh operation. However, such "monitoring methods" generally operate under certain assumptions regarding average critical levels for leakage current or stored charge. They do not account for the presence of below-average or weak memory cells.

Additionally, some early conventional monitoring methods fail to account for the effects of changes in the ambient operating environment of the memory device. This is a significant oversight since memory cell leakage current varies with temperature. Thus, current conventional monitoring methods control the self refresh operation of a memory device in accordance with a temperature measured for the memory device by a temperature sensing circuit. The temperature sensing circuit may be on-chip or off-chip.

Temperature controlled self refresh operations typically divide an expected operating temperature range into a plurality of temperature control zones and modify the period of the refresh operation in accordance with the current measured control zone, thereby prolonging the refresh cycle at low temperatures.

Obviously, the effectiveness of such temperature controlled, self refresh operations depends on the precision with which the actual operating temperature of the memory device is detected by the temperature sensing circuit.

One conventional temperature sensing circuit generally employs a band-gap reference circuit. See, for example, published U.S. patent application No. 2004-0071191 filed Apr. 15, 2004. Such a band-gap reference circuit enabled temperature sensing circuit comprises a diode terminal and a resistance terminal connected in parallel. Resistance magnitudes are matched in the circuit, such that currents flowing from these two terminals for a predetermined temperature will be equal. This result follows from an assumption that the respective terminal currents will be opposite one to another at the predetermined temperature.

In order to provide precise control over a self refresh operation using this type of temperature sensing circuit, fabrication process-induced variations in the circuit components must be accounted for. For example, a trimming operation is typically required to correct fabrication process-induced variations in a diode of the temperature sensing circuit. That is, before actual operation of the temperature sensing circuit, sensitivity reaction testing may be performed in relation to resistance and/or current change characteristics for the diode.

FIG. 1 illustrates a conventional temperature sensing circuit.

Referring to FIG. 1, a temperature sensing circuit 20 comprising a band gap reference circuit includes a temperature sensing unit 22 and a deviation temperature detecting unit 24. The temperature sensing unit 22 includes a current mirror type differential amplifiers DA1 and DA2, a subtraction resistance(Ra) terminal through which current is reduced in accordance with a temperature increase, an addition resistance terminal (R) through which current is increased in accordance with a temperature increase, and a comparator DA3 adapted to compare a test temperature with a sensed temperature and output a comparison result as a comparison output signal (Tout). The temperature sensing unit 22 also includes junction diodes D1 and D2 respectively coupled to differential amplifier DA1 and DA2. Junction diodes D1 and D2 may have different sizes and are thus represented in FIG. 1 as having a size ration of M to 1.

The deviation temperature detecting unit 24 includes a weighted resistance string comprising a plurality of binary weighted resistances RAi and RA4 through RA0 connected in series between the subtraction resistance (Ra) terminal and a ground terminal (VSS). Deviation temperature detecting unit 24 also includes a short switching circuit adapted to selectively short individual binary weighted resistances in response to test input signals or trimming address signals (Taddi and Tadd4 through Tadd0) applied to the deviation temperature detecting unit 24. In the illustrated example, the short switching circuit is constructed of N-type MOS transistors (Ni and N4 through N1) that are normally turned "OFF".

Among the binary weighted resistances, resistance RA4 has a resistance value 16 times larger than the resistance value of resistance RA0. Resistance RA3 has a resistance value 8 times larger than the value of resistance RA0. Resistance RA2 has a resistance value 4 times larger than the value of resistance RA0. Resistance RA1 has a resistance value twice as large as the value of resistance RA0. The binary weighted resistances RAi and RA4–RA0 may be formed by patterning material such as polysilicon, for example.

In operation, for example, when resistance RA0 is shorted by turning transistor N0 "ON", its resistance value is removed from the composite resistance value of the binary weighted resistances. Thus, current la flowing from the subtraction resistance terminal (Ra) to ground increases accordingly. In the conventional circuit, the removal of resistance RA0 is designed to adjust for an increase in temperature of 1□. The test input signals or trimming addresses may be designed accordingly to change a trip point for the temperature sensing circuit at a predetermined temperature while the circuit is operating in a test mode.

Similarly, as indicated by a logically high test input signal Tadd4, for example, the resistance RA4 may be shorted and thus removed from the composite resistance to thereby adjust the trip point to a temperature increases of 16□. Similarly, respective trimming address signals Tadd3, Tadd2, and Tadd1 may be used to selectively remove resistance RA3, resistance RA2, and resistance RA1 from the composite resistance in order to adjust the trip point for temperature increases of 8□, 4□, and 2□. In similar manner, the binary weighted resistances may be used to approximate a binary successive approximation method of control for temperature deviations having an error of less than 1□. An accurate trimming operation may thus be implemented.

In this conventional trimming operation applied to the conventional temperature sensing circuit, a Mode Register Set (MRS) signal is also provided in relation to the operation of the temperature sensing circuit. The MRS signal is applied as a drive signal to the temperature sensing circuit controlling the number of binary weighted resistances to be used in the temperature sensing circuit relative to the detection of a desired temperature. Once the MRS signal is established a fuse trimming operation may be performed to match the resulting composite resistance value and thereby correct for a fabrication process-induced variation in the diode.

However, the foregoing approach assumes that the trimming operation, as controlled in an MRS mode by an MRS signal, faithfully replicates actual operating conditions for the memory device. Where this assumption fails, the actual self refresh operation may not function as intended under actual operating conditions. That is, the temperature matched during the trimming operation may be different from the temperature of the actual self refresh operation, which may impede refresh and current characteristics for the memory device.

Accordingly, it would be beneficial to provide a memory device supporting an improved self refresh mode and related method of operation. The improved self refresh mode would be adapted to more precisely control its refresh period as a function of temperature, as between a trimming operation designed to correct fabrication process-induced variations and the actual operating temperature of memory device.

SUMMARY OF THE INVENTION

In one embodiment, the invention provides a semiconductor memory device supporting a self refresh operation, the memory device comprising; an address buffer unit, controllable to be enabled during the self refresh operation, and adapted to generate an internal address signal in response to a first external control signal and an external address signal, and an operation control unit adapted to control the self refresh operation in response to the internal address signal.

In another embodiment, the invention provides a method of operating a semiconductor memory device adapted to support a self refresh operation and comprising a temperature sensing circuit, the method comprising; enabling an address buffer unit in response to a first external control signal, starting the self refresh operation, generating an internal address signal in response to an external address signal, enabling the temperature sensing circuit, generating a trimming address signal in response to the internal address signal, and performing a trimming operation in the temperature sensing circuit in response to the trimming address signal.

BRIEF DESCRIPTION OF THE DRAWINGS

Embodiments of the invention will be described in relation to the accompanying drawings. In the drawings.

DESCRIPTION OF EXEMPLARY EMBODIMENTS

Exemplary embodiments of the invention will now be described in some additional detail with reference to FIGS. 2 and 3. However, it will be understood by those skilled in the art that the invention may be variously embodied and that the scope of the invention is not limited to only the described embodiments. Rather, the embodiments are presented as teaching examples.

Figure 1:
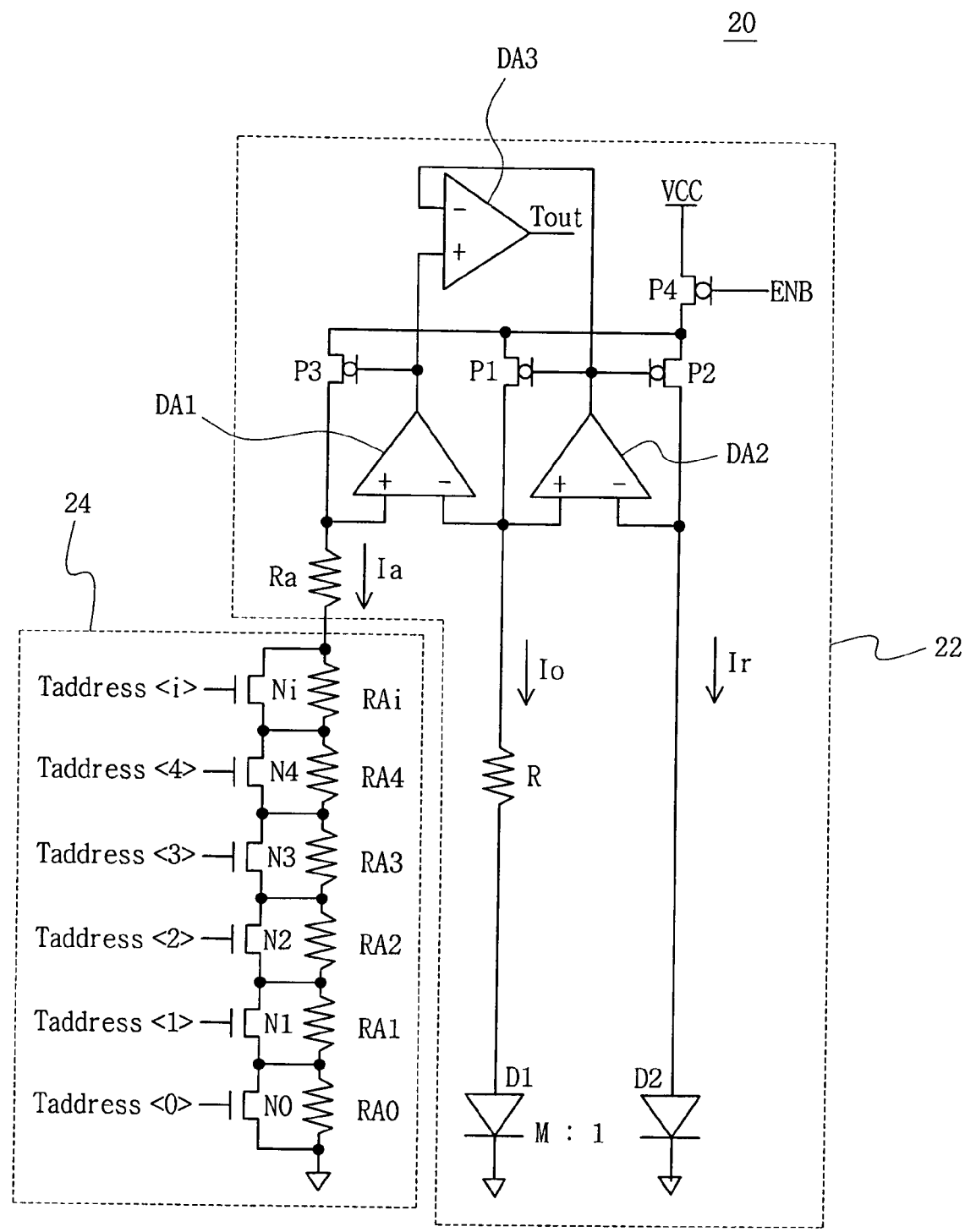
FIG. 1 is a circuit diagram of a conventional temperature sensing circuit.
Figure 2:
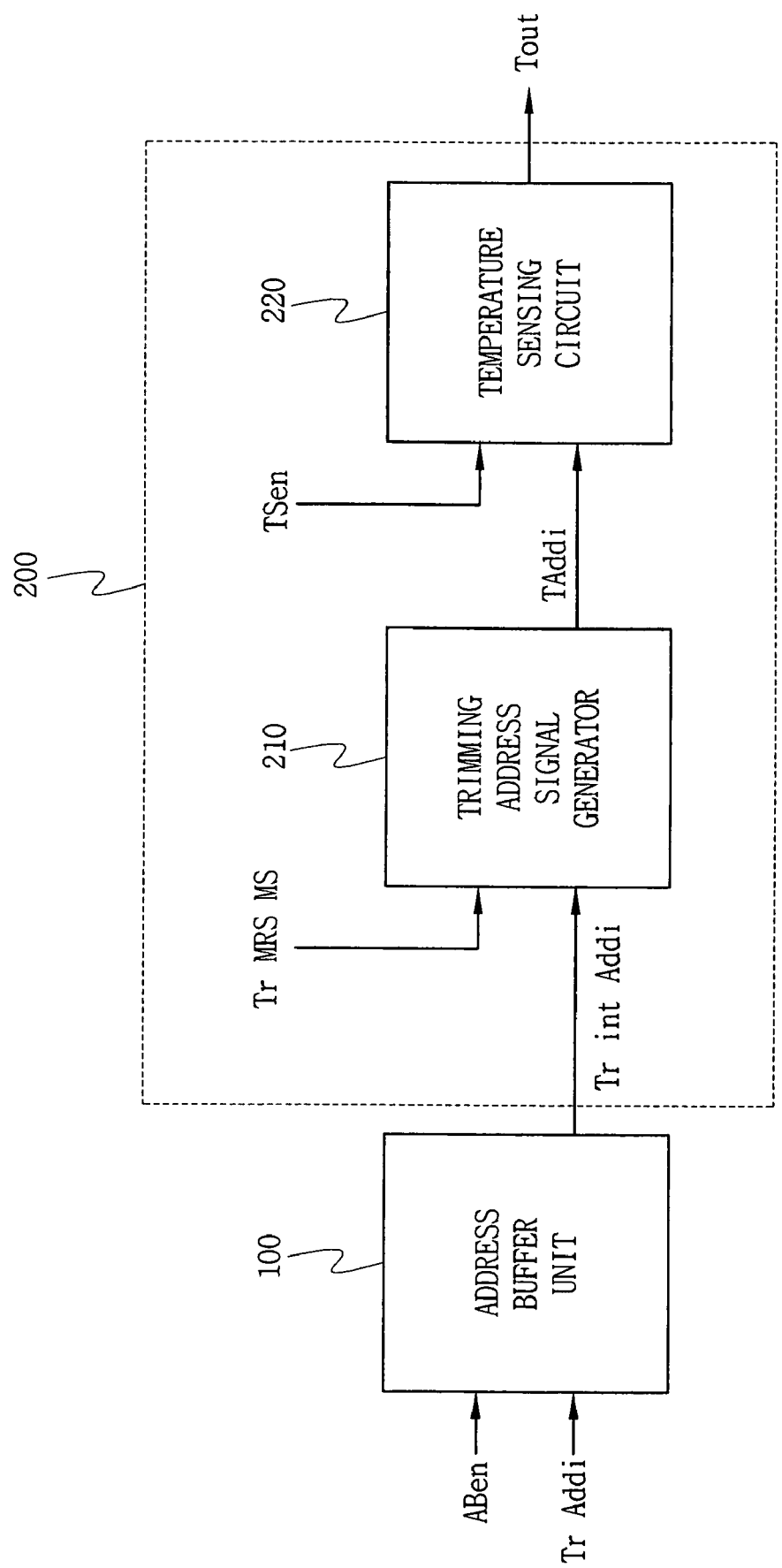
FIG. 2 is a block diagram of a semiconductor memory device according to an exemplary embodiment of the invention.

FIG. 2 is a block diagram schematically illustrating a memory device supporting a self refresh mode of operation in accordance with one embodiment of the invention.

Referring to FIG. 2, the exemplary memory device comprises an address buffer unit 100 and an operation control unit 200. Its operation is performed in response to an externally supplied address signal which may be applied even during self refresh mode operation.

In the illustrated example, operation of the address buffer unit 100 is controlled by a first externally provided control signal (ABen). An internal address signal (Tr int Addi) is generated in response to the externally provided address signal (Tr Addi). The externally provided address signal (Tr Addi) generally controls the operation state of the memory device, and may be applied during the self refresh mode of operation.

By way of comparison, the conventional memory device does not include circuitry adapted to buffer an externally provided address signal buffer while the memory device is operating in a self refresh mode. However, the exemplary embodiment of the invention shown in FIG. 2 comprises address buffer unit 100 which is configured to operate even in the self refresh mode.

The first external control signal (ABen), adapted to control the operation of the address buffer unit 100, may be derived, for example, from a logical NOR operation between a general buffer enable signal and a trimming MRS signal, and acts as an enable signal for the address buffer 100. Alternatively, the external control signal (ABen) may be derived from the trimming MRS signal. However derived, the first external control signal (ABen) may be adapted to enable the address buffer unit 100 during any mode of operation, so long as a valid trimming MRS signal is available.

The operation control unit 200 is responsive to the internal address signal (Tr int Addi) generated after the memory device initiates a self refresh mode of operation under the command of the first external control signal (ABen).

In one embodiment, the operation control unit 200 comprises a trimming address signal generator 210 and a temperature sensing circuit 220. The trimming address signal generator 210 generates a trimming address signal (Taddi) in response to the internal address signal (Tr int Addi). The trimming address signal generator 210 is controlled by a second externally provided control signal (Tr MRS MS). The second external control signal (Tr MRS MS) indicates a temperature condition, for example, whether an externally provided temperature signal is higher or lower than a predetermined temperature signal output from the temperature sensing circuit 220. This temperature condition may be used to perform trimming operations, and/or to control the state of trimming address signal (Taddi).

Operation of the temperature sensing circuit 220 is controlled by a temperature enable signal (TSen). The temperature sensing circuit 220 performs trimming operations in response to the trimming address signal (Taddi) to output a temperature signal (Tout) based on an internal temperature change of the memory device by using a precise trip point. The trimming operation of the temperature sensing circuit 220 may be performed using a method similar to the conventional method described above, save said method may be performed during a self refresh mode of operation.

For example, the temperature sensing circuit 220 may comprise a band gap reference circuit, in which a diode terminal and a resistance terminal are connected in parallel, and resistance magnitudes are matched to each other so that values of currents flowing in two terminals in a determine temperature become equal by using a characteristic that temperature characteristics of currents flowing in the respective terminals are opposite to each other, thereby detecting and outputting a predetermined temperature.

Figure 3:
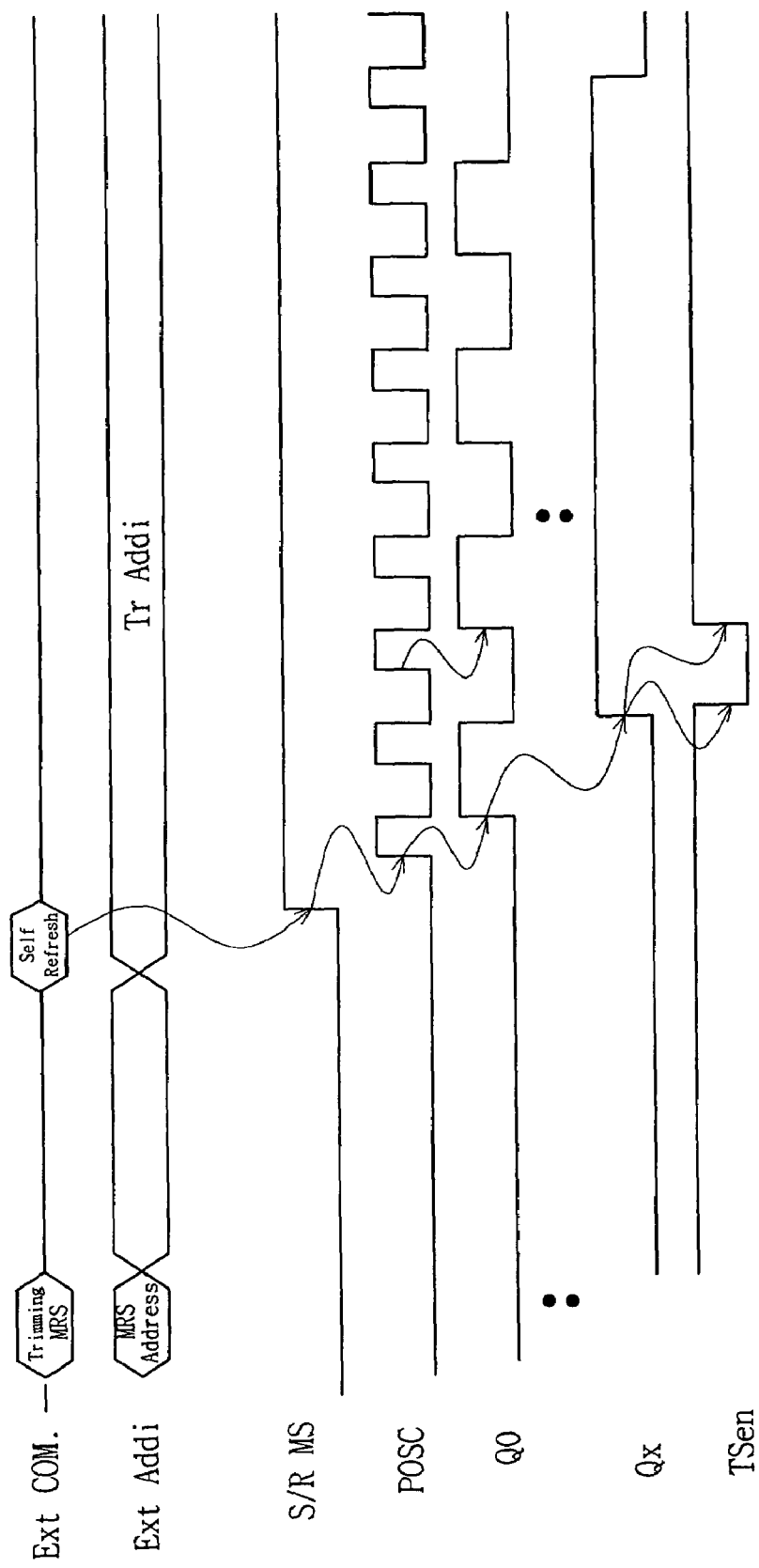
FIG. 3 illustrates timings in an enable signal generation of temperature sensing circuit shown in FIG. 2.

FIG. 3 is a timings diagram illustrating one exemplary method of generating a temperature enable signal adapted to enable the temperature sensing circuit 220.

As shown in FIG. 3, a trimming MRS signal Trimming MRS), (e.g., command signal Ext COM.) and an MRS address signal(MRS Address) (e.g., Ext Addi) are externally applied to the memory device and a trimming mode of operation is entered. The address buffer unit 100 within the memory device is enabled by the trimming MRS signal.

When the memory device enters the self refresh mode of operation, a Set/Rest control signal (e.g., S/R MS) adapted to use in general self refresh mode operations is generated. Respective, self refresh cycle signals (POSC and Q0 through Qx) adapted to control or define the period of the self refresh mode are then generated in response to the set/reset control signal (S/R MS). The set/reset control signal (S/R MS) thus serves as a master clock signal (or master clock initiation signal) adapted to generate the self refresh cycle signals (POSC and Q0 though Qx). The self refresh cycle signals (POSC and Q0 through Qx) are generated with different periods or frequencies. For example, a first self refresh cycle signal (POSC) may have a first and shortest cycle period while the subsequent (e.g., the second through nth) self refresh cycle signals (Q0 through Qx may respectively have incremental cycle periods that increased by 2× one over the other beginning with the first self refresh cycle signal (POSC). The subsequent self refresh cycle signals (Q0 through Qx) may be sequentially generated in response to each previously generated self refresh cycle signal having a shorter period cycle. For example, the subsequent self refresh cycle signals (Q0 through Qx) may be generated using a corresponding plurality of refresh counters. The temperature enable signal (TSen) adapted to enable the temperature sensing circuit 220 may be generated from in one or more of the self refresh cycle signals (POSC or Q0 through Qx) as output from one or more of the plurality of refresh counters.

After the temperature sensing circuit 220 is enabled, the external address signal (Tr Addi) is applied to the address buffer unit 100 and the internal address signal (Tr int Addi) is generated. A trimming address signal (Taddi) is generated in response to the internal address signal (Tr int Addi) and a trimming operation for the temperature sensing circuit 220 is performed.

After completion of the trimming operation, the temperature sensing circuit 220 outputs the temperature sensing output signal (Tout) during an actual self refresh operation, and may change the self refresh cycle of the operation in response to the temperature sensing output signal (Tout). In a case where the temperature of the memory device is too low, the self refresh cycle is extended as compared with a case where the temperature of the memory device is too high.

As described above, the trimming operation provided by the temperature sensing circuit within the memory device may be performed under actual operating conditions while the memory device is operating a self refresh mode, as opposed to a MRS test mode. As such, the self refresh cycle may be precisely adjusted and controlled in accordance with actual temperature changes. Performance of the memory device, particularly as it relates to power consumption during refresh operations is improved accordingly.

It will be apparent to those skilled in the art that modifications and variations may be made to the foregoing embodiments of the invention without deviating from the scope of the invention which is defined by the attached claims. For example, internal circuit configuration may be varied or internal elements of the respective circuit may be replaced with equivalent elements and/or circuits.

What is claimed is:

1. A semiconductor memory device supporting a self refresh operation, the memory device comprising:
   an address buffer unit, controllable to be enabled during the self refresh operation, and adapted to generate an internal address signal in response to a first external control signal and an external address signal; and
   an operation control unit adapted to control the self refresh operation in response to the internal address signal.

2. The memory device of claim 1, wherein the operation control unit comprises:
   a trimming address signal generator adapted to generate a trimming address signal in response to the internal address signal; and
   a temperature sensing circuit adapted to perform a trimming operation in response to the trimming address signal, and generate a temperature signal in response to a temperature change of the memory device as defined by a precise trip point.

3. The memory device of claim 2, wherein the memory device is adapted to perform a trimming operation in the temperature sensing circuit during the self refresh mode.

4. The memory device of claim 3, wherein the operation control unit further comprises:

a plurality of counters adapted to generate a plurality of self refresh cycle signals having different cycle periods and adapted to control the cycle of the self refresh operation.

5. The memory device of claim 4, wherein operation of the temperature sensing circuit is controlled by at least one of the plurality of self refresh cycle signals.

6. The memory device of claim 5, wherein the temperature sensing circuit comprises a band gap reference circuit.

7. The memory device of claim 6, wherein the band gap reference circuit comprises:

a diode terminal and a resistance terminal connected in parallel; and, matched resistance magnitudes adapted to generate equal currents from the diode and resistance terminals in relation to a predetermined temperature.

8. A method of operating a semiconductor memory device adapted to support a self refresh operation and comprising a temperature sensing circuit, the method comprising:

enabling an address buffer unit in response to a first external control signal;

starting the self refresh operation;

generating an internal address signal in response to an external address signal;

enabling the temperature sensing circuit;

generating a trimming address signal in response to the internal address signal; and performing a trimming operation in the temperature sensing circuit in response to the trimming address signal.

9. The method of claim 8, wherein the temperature sensing circuit comprises a band gap reference circuit, comprising a diode terminal and a resistance terminal connected in parallel, and resistance magnitudes matched to generate equal currents from the diode and resistance terminals in relation to a predetermined temperature.

10. The method of claim 9, wherein a generation of the internal address signal is controlled by a second external control signal.

11. The method of claim 9, further comprising:

generating a plurality of self refresh cycle signals having different cycle periods and adapted to control the cycle of the self refresh operation.

12. The method of claim 11, wherein operation of the temperature sensing circuit is controlled by at least one of the plurality of self refresh cycle signals.

* * * * *